United States Patent [19]

Stephens et al.

[11] 4,171,509

[45] Oct. 16, 1979

[54] BRIDGE DRIVE CIRCUIT AND METHOD

[75] Inventors: Mark L. Stephens, Campbell; Paul R. Gray, Orinda, both of Calif.

[73] Assignee: Signetics Corporation, Sunnyvale, Calif.

[21] Appl. No.: 870,620

[22] Filed: Jan. 19, 1978

[51] Int. Cl.$^2$ .............................................. G01L 1/18
[52] U.S. Cl. .............................. 323/75 C; 323/75 N; 73/362 AR
[58] Field of Search ................... 73/362 AR, 362 SC; 323/75 C, 75 E, 75 N

[56] References Cited

U.S. PATENT DOCUMENTS

| | | | |
|---|---|---|---|
| 3,341,757 | 9/1967 | Cate | 323/75 N |
| 3,495,159 | 2/1970 | Smith | 323/69 |
| 3,754,442 | 8/1973 | Arnett | 323/75 N |
| 3,893,192 | 7/1975 | Jensen | 324/65 R |
| 3,943,434 | 3/1976 | Haeusler et al. | 323/75 N |

OTHER PUBLICATIONS

Guyton, "Feedback Linearizes Resistance Bridge", Electronics, Oct. 23, 1972, p. 102.

*Primary Examiner*—A. D. Pellinen
*Attorney, Agent, or Firm*—Jerry A. Dinardo; Thomas A. Briody; Edward J. Connors, Jr.

[57] ABSTRACT

A bridge circuit for a measurement bridge of the type using four impedance arms provides an output referenced to ground which is a function of the impedances in the respective arms. The bridge circuit includes an impedance bridge comprising first, second, third and fourth impedance arms connected in series loop with first, second, third and fourth bridge terminals serially defined at the connections between the respective arms. A source of constant current is connected between the first terminal and ground. A driver is connected to bridge terminals other than the output terminal. The driver is responsive to bridge terminal signals to provide a bridge output which is a function of the impedances in the respective arms.

6 Claims, 3 Drawing Figures

BRIDGE DRIVE CIRCUIT AND METHOD

BACKGROUND OF THE INVENTION

This invention relates generally to electronic bridge circuitry and structures. More particularly, this invention relates to bridge circuit and structure suitable for use in discrete element electronic circuits as well as integrated circuitry including a plurality of active and passive devices.

Although electronic bridge circuits and structures have heretofore been provided, such circuits and structures generally require a plurality of voltage supplies to drive the bridge circuit, provide only a balanced output for a balanced bridge input, require additional amplifiers to provide a single ended output, and require additional temperature compensation circuitry for operation. Smith, U.S. Pat. No. 3,495,159 is representative of this type of circuit. The bridge circuit suffers from requiring a number of amplifiers, the voltage supplies must track each other, and the bridge output is non-linear if the impedance elements do not vary in the same percentage amount for applied stimulus such as physical displacement, stress or acceleration applied to the bridge arms. Thus, there is a need for a high performance bridge circuit and structure for use in electronic bridge structures such as transducers for providing a bridge output in response to stress, acceleration or physical displacement.

OBJECTS AND SUMMARY OF THE INVENTION

Accordingly, it is a general object of the present invention to provide an improved performance bridge circuit and structure for electronic bridge applications.

It is a particular object of the present invention to provide an improved bridge circuit and structure which may be utilized in discrete as well as integrated circuitry for performing measurement bridge and transducer functions by providing greatly improved characteristics in response to bridge stimulus.

The foregoing and other objects of the invention are achieved in a measurement bridge of the type using four impedance arms for providing a bridge output referenced to ground which is a function of the impedances in the respective arms. The measurement bridge circuit includes an impedance bridge comprising first, second, third and fourth impedance arms connected in a series loop. First, second, third and fourth bridge terminals are serially defined at the connections between the respective arms. Current source means is connected between the first terminal and ground. Drive means is provided having inverting and non-inverting inputs and an output. The inverting input is connected to the second bridge terminal and the non-inverting input is connected to ground. The output of the drive means is connected to the third bridge terminal. The drive means is responsive to signals at its input for driving the third terminal to ground potential to provide a bridge output between the fourth terminal and ground which is a function of the impedances in the respective arms.

BRIEF DESCRIPTION OF THE PREFERRED EMBODIMENT

Figure 1:
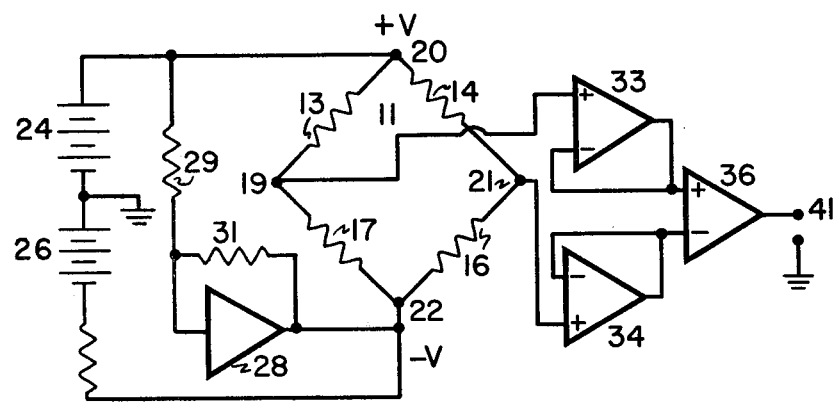
FIG. 1 is a schematic diagram of prior art bridge circuitry used in measurement bridge transducer circuits.

A measurement bridge including a bridge circuit and voltage means of the type known in the prior art is shown in FIG. 1. The measurement bridge includes bridge circuit 11 including impedance arms 13, 14, 16, and 17. The respective impedance arms are connected in a series loop with bridge terminals 19, 20, 21, and 22 serially defined around the loop at each of the connections between the respective arms. A voltage means 24 is generally provided having a positive terminal connected to terminal 20 and the negative terminal connected to ground or common. Additional voltage means 26 is generally provided having a potential identical with that of means 24 and having a position terminal connected to common and a negative terminal connected to bridge terminal 22. First amplifier means 28 is provided having an input serial resistor 29 connected between the input of amplifier 28 and the terminal 20 or positive voltage terminal of the bridge circuit. The output of amplifier 28 is connected to bridge terminal 22. A feedback resistor 31 is connected between the output and the input of amplifier 28. Amplifier 28 is provided to regulate the bridge voltage, that is the voltage potential between terminals 20 and 22 in order to ensure the supplies 24 and 26 track each other and maintain a constant bridge potential. Additional amplifier means are generally required in the form of amplifiers 33 and 34, wherein the non-inverting input to amplifier 33 is connected to one of the balanced bridge terminals 19, and the inverting input is connected to the output of amplifier 33. The output is connected to the non-inverting input of amplifier 36 which has an output connected to output terminal 41. In like manner, amplifier 34 has a non-inverting input connected to terminal 21 of the bridge circuit, and an inverting input connected to the amplifier output. The output is connected to the inverting input of amplifier 36. In operation, the prior art circuit senses changes at each of the respective bridge arms, and maintains equal and opposite voltages at the terminals 20 and 22 by amplifier 28 to ensure tracking. The bridge circuit provides a balanced output at terminals 19 and 21 in response to changes in the bridge impedances. The output is amplified by amplifiers 33 and 34 and converted to a single-ended output by amplifier 36 for providing an output signal at terminal 41 with respect to ground.

Figure 2:
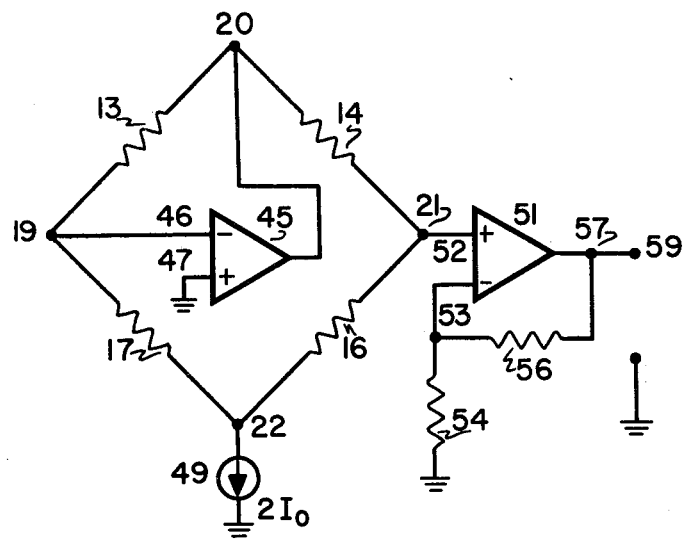
FIG. 2 is a schematic diagram of a measurement bridge circuit and structure in accord with the invention.

The bridge circuit utilized in accord with the present invention is shown in FIG. 2. The impedance bridge circuit includes first, second, third and fourth impedance arms 13, 14, 16 and 17 connected in a series loop with first, second, third and fourth bridge terminals 19, 20, 21 and 22 serially defined at the connections between the respective arms. The impedances of the respective arms may of course be purely resistive, or may take on other impedance values having real and imaginary components. Further, the arm impedance may be of equal magnitude, may have equal magnitudes with opposite and imaginary signs, and may differ by predetermined ratios as is commonly known in the art.

The bridge circuit further includes current source means 49 connected between terminal 22 and ground and having a magnitude of 2I₀. Drive means 45 is included having an inverting input 46 connected to terminal 19, a non-inverting input 47 connected to ground or common, and an output connected to terminal 20. The drive means may be one of many types of operational amplifiers well known in the art, such as Signetics part number LM101. The bridge circuit further includes an amplifier 51, which may likewise be of the LM101 type. Amplifier 51 has a non-inverting input 52 connected to terminal 21, an inverting input 53 connected to ground or common via a resistor 54, and an ouput 57 connected to output terminal 59. Resistor 54 is known in the art as $R_S$. A feedback resistor 56, referred to in the art as $R_f$, is connected between output terminal 57 and input terminal 53.

Figure 3:
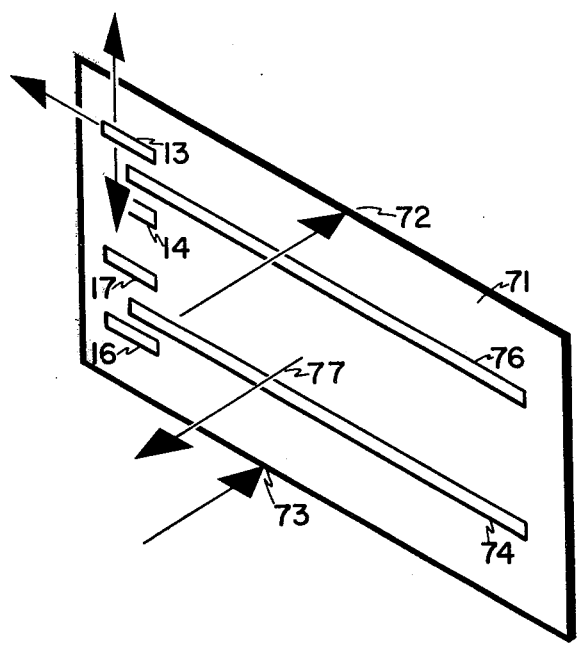
FIG. 3 is an isometric view of a transducer structure having impedance bridge arm elements disposed thereon and connected in accord with the invention.

Referring to FIG. 3, an embodiment illustrating the physical positioning of the bridge impedance arms is shown. A planar transducer membrane 71 having an elongate rectangular geometry is carried by fixed mounts 72 and 73 at opposite edges of the membrane in a plane perpendicular to the generally elongate dimension of the membrane. Spaced, generally parallel, elongate slots 74 and 76 are formed extending in the elongate dimension of the membrane 71 to define central and outer members. A portion of the central member spaced between the slots and intermediate the elongate extremes thereof, such as area 77, is adapted to receive force or acceleration components. By way of operative example, a small mass affixed to the membrane at 77 causes the central and outer members to flex under acceleration with respect to the fixed portions of the membrane at the mounts 72 and 73. Similarly, force or physical displacement components may be applied at area 77 to displace the central and outer members relative to the fixed transducer mounts 72 and 73.

The impedance arm elements 13–17 may be piezoresistive elements formed on a silicon membrane 71 and positioned to sense flexural changes in the membrane in response to force applied at area 77. The four impedance arm elements may be positioned along or at the ends of the elongate slots such as in a line generally perpendicular to the elongate dimension of the slots. Elements 14 and 17 may be positioned on the central member of the membrane and elements 13 and 16 on the respective outer members of the membrane. With the longitudinal portion of the piezoresistive elements generally parallel to the elongate slots, force components which are longitudinal in direction produce longitudinal changes in the piezoresistive elements. Force components which are tangential in direction produce tangential changes in the piezoresistive elements.

Turning to operation, when a force is applied at area 77, arms 13 and 16 may be in compression and elements 14 and 17 in tension for a given physical displacement. Accordingly, this causes corresponding resistance arm changes in the bridge arms of FIG. 2. The bridge imbalance at terminal 19 is sensed at input 46 of amplifier 45, and amplifier 45 provides a corresponding output to drive terminal 20 in such manner as to drive terminal 19 to ground potential to provide an output signal at terminal 21. The output signal is amplified by amplifier 51 which provides a single-ended output signal at terminal 59 corresponding to the physical displacement of the transducer membrane.

The greatly improved linearity may be better appreciated by examining four cases of bridge resistance. The four cases represent bridge resistor variations and tolerances as will be seen. For each case, the present current drive invention is compared with the prior art voltage drive.

For case 1, assume the bridge impedances 13 ($R_1$), 17 ($R_2$), 14 ($R_3$), and 16 ($R_4$) are all equal to a value R with zero (0) stress applied to the transducer. Thus, $$\frac{\Delta R_1}{R_1} = \frac{\Delta R_4}{R_4} = \frac{\Delta R}{R}$$

increase and $$\frac{\Delta R_2}{R_2} = \frac{\Delta R_3}{R_3} = \frac{\Delta R}{R}$$

decrease.

Assume for case 2, $R_1=R_2=R_3=R_4=R$ with zero (0) stress applied.

$$\frac{\Delta R_1}{R_1} = \frac{\Delta R_4}{R_4} = \frac{\Delta R_L}{R} \text{ (longitudinal)}$$

$$\frac{\Delta R_2}{R_2} = \frac{\Delta R_3}{R_3} = \frac{\Delta R_T}{R} \text{ (tangential)}$$

For case 3, assume a variation in the bridge resistors where $R_A$ is a predetermined value and $K(R_A)$ is the variation therefrom:

$R_1=R_2=R_A$ at zero (0) stress
$R_3=R_4=K(R_A)$ at zero (0) stress $$\frac{\Delta R_1}{R_1} = \frac{\Delta R_{LA}}{R_A} \text{ where } R_L \text{ is the longitudinal component}$$

$$\frac{\Delta R_2}{R_2} = \frac{\Delta R_{TA}}{R_A} \text{ where } R_T \text{ is the tangential component}$$

Therefore:

$$\frac{\Delta R_3}{R_3} = \frac{\Delta R_{TA}}{R_A}$$

$$\frac{\Delta R_4}{R_4} = \frac{\Delta R_{LA}}{R_A}$$

For case 4, assume impedance arm values of $R_1=10K$, $R_2=11K$, $R_3=13K$, and $R_4=12K$ with zero (0) stress applied. Then application of a first light force A provides $$\frac{\Delta R_1}{R_1} = \frac{\Delta R_4}{R_4} = 10^{-5}$$

$$\frac{\Delta R_2}{R_2} = \frac{\Delta R_3}{R_3} = 10^{-5}$$

and for application of a large force B provides $$\frac{\Delta R_1}{R_1} = \frac{\Delta R_4}{R_4} = .1$$

$$\frac{\Delta R_2}{R_2} = \frac{\Delta R_3}{R_3} = .1$$

Having defined cases 1–4, drive potentials may now be applied. For case 1, prior art voltage drive provides:

$$V_{AB} = \left[ \frac{R R_4 - R_2 R_3}{(R_3 + R_4)(R_1 + R_2)} \right] 2V_O$$

$$V_{AB} = 2V_O \frac{\Delta R}{R}$$

Current drive in accord with the present invention provides:

$$V_{AB} = 2I_O \left[ \frac{R_1 R_4 - R_2 R_3}{R_1 + R_2 + R_3 + R_4} \right]$$

$$= 2I_O R \left[ \frac{\Delta R}{R} \right]$$

Thus for the case of matched $$\frac{\Delta R}{R}$$

in all bridge legs, both drive methods provide similar expressions and produce neglible non-linearity error results.

For case 2, prior art voltage drive provides:

$$V_{AB} = 2V_O \frac{(\Delta R_L - \Delta R_T)}{(2R + \Delta R_T + \Delta R_L)}$$

$$V_{AB} = 2V_O \frac{\left[ \frac{\Delta R_L}{R} - \frac{\Delta R_T}{R} \right]}{\left[ 2 + \frac{\Delta R_L}{R} + \frac{\Delta R_T}{R} \right]}$$

For current drive in accord with the present invention:

$$V_{AB} = 2I_O \frac{[\Delta R_L - \Delta R_T]}{2}$$

$$= 2I_O R \left[ \frac{\Delta R_L}{R} - \frac{\Delta R_T}{R} \right] \frac{1}{2}$$

It is to be observed that the voltage drive denominator terms yield a voltage output which is non-linear with respect to $$\frac{\Delta R}{R}$$

variations. The present invention current drive provides no non-linear terms.

For case 3, prior art voltage drive provides:

$$V_{AB} = 2V_O \frac{\left[ \frac{\Delta R_{LA}}{R_A} - \frac{\Delta R_{TA}}{R_A} \right]}{\left( 2 + \frac{\Delta R_{LA}}{R_A} + \frac{\Delta R_{TA}}{R_A} \right)}$$

The present invention current drive provides:

$$V_{AB} = 2I_O R_A \frac{K}{K+1} \left[ \frac{\Delta R_{LA}}{R_A} - \frac{\Delta R_{TA}}{R_A} \right]$$

As in case 2, prior art voltage drive exhibits non-linear terms in the demoninator for the voltage expression $V_{AB}$. Present invention current drive provides, even for this mismatched $\Delta R$ condition, only a small scale factor error with no corresponding non-linearity. For $K \cong 1$ $$\frac{\Delta R_L}{R_A} \cong -\frac{\Delta R_T}{R_A},$$

but this approximation is not sufficient to eliminate the non-linearity in the voltage drive circuit.

For the case 4, situation, prior art voltage drive provides:

$V_{AB}$ at zero (0) stress $= 2V_O[-0.043809523]$
$V_{AB}$ at A stress $= 2V_O[-0.043800541]$
$V_{AB}$ at B stress $= 2V_O[+0.0454156226]$
$V_{AB}|_A - V_{AB}|_0 = (8.98178 \times 10^{-6}) 2V_O$
$V_{AB}|_B - V_{AB}|_0 = (8.92851456 \times 10^{-2}) 2V_O$ The output $V_{AB}$ corrected for zero offset, that is $(V_{AB}|_0)$, increases by a factor of $10^4$ between the small force A and the large force B. The prior art provides a non-linearity of 0.59%.

In this example, the small applied force A produces a $$\frac{\Delta R}{R}$$

of $10^{-5}$ and large force B provides a $$\frac{\Delta R}{R}$$

of $10^{-1}$. Although this is an extreme test, it exhibits a necessary test for bridge linearity.

For case 4, the present invention current drive provides:

$V_{AB}$ at zero (0) stress $= (-0.500000) 2I_O$
$V_{AB}$ at A stress $= (-0.4998977827) 2I_O$
$V_{AB}$ at B stress $= (0.5221434745) 2I_O$
$V_{AB}|_A - V_{AB}|_0 = (1.022173 \times 10^{-4}) 2I_O$
$V_{AB}|_A - V_{AB}|_0 = (1.0221434745) 2I_O$ The output increases by $10^4$ to a non-linearity of 0.0029%. This is an improvement of approximately 200 times the voltage drive case and provides improved, wide dynamic range transducers. For identical bridge arms in present transducers, this invention provides a factor of 200 improvement in linearity with the present sensor system. Thus the present current drive invention may possibly improve a present $10^3$ range transducer to well beyond $10^4$. With far less complexity than the voltage drive system, the present invention provides a significant contribution to bridge circuit transducers.

Thus it is clear that the present invention provides an improved performance bridge circuit and structure for electronic bridge applications.

Further, the present invention provides an improved bridge circuit and structure which may be utilized in discrete as well as integrated circuitry for performing measurement bridge and transducer functions by providing greatly improved characteristics in response to bridge stimulus.

What is claimed is:

1. In a measurement bridge of the type using four impedance arms for providing a bridge output referenced to ground which is a function of the impedances in the respective arms, the bridge circuit comprising, an impedance bridge including first, second, third and fourth impedance arms connected in a series loop with first, second, third and fourth bridge terminals serially defined at the connections between the respective arms, current source means connected between said first terminal and ground for providing a predetermined fixed value of current therebetween, drive means having inverting and non-inverting inputs and an output, said inverting input connected to the second bridge terminal, the non-inverting input connected to ground and the output connected to the third bridge terminal, said drive means being responsive to signals at the inputs for driving the second terminal to ground potential to provide a bridge output between said fourth terminal and ground which is a function of the impedances in the respective arms.

2. A measurement bridge as in claim 1 wherein each of said first, second, third and fourth impedances may vary independently in response to external stimulus.

3. A measurement bridge as in claim 1 wherein said drive means is an operational amplifier having at least unity gain.

4. A measurement bridge as in claim 1 wherein said bridge provides an output which is a function of the impedance change in the respective arms and said drive means provides an output which is a function of the impedance change in the respective arms.

5. A measurement bridge as in claim 1 together with additional amplifier means having predetermined gain interposed between said fourth terminal and said output.

6. In a method for providing a bridge circuit output referenced to ground which is a function of the impedance change in the respective arms of the bridge, said bridge being of the type utilizing plural impedance arms having bridge terminals defined therebetween, together with constant current source means and drive means connected to said terminals other than said output, the steps comprising, causing the impedance of at least one of said arms to change, and driving, in response to signals produced thereby, said terminals other than said output terminal to ground potential to thereby provide an output with respect to ground which is a function of the impedance change in the respective arms.

* * * * *